United States Patent
Radomski et al.

(10) Patent No.: US 6,417,732 B1
(45) Date of Patent: Jul. 9, 2002

(54) CONTROLLER FOR RF POWER GENERATOR WITH REDUCED CABLE LENGTH SENSITIVITY

(75) Inventors: Aaron T. Radomski, Wyoming; Kevin P. Nasman, North Chili, both of NY (US)

(73) Assignee: ENI Technology, Inc., Rochester, NY (US)

( * ) Notice: Subject to any disclaimer, the term of this patent is extended or adjusted under 35 U.S.C. 154(b) by 0 days.

(21) Appl. No.: 09/827,723

(22) Filed: Apr. 6, 2001

(51) Int. Cl.[7] .............................................. H03F 21/00
(52) U.S. Cl. ................... 330/207 P; 455/115; 455/117; 330/298
(58) Field of Search ............................. 330/207 P, 298; 455/115, 117

(56) References Cited

U.S. PATENT DOCUMENTS

| | | | | |
|---|---|---|---|---|
| 3,870,957 A | * | 3/1975 | Straw | 325/150 |
| 4,122,400 A | * | 10/1978 | Medendorp et al. | 330/207 P |
| 4,249,258 A | * | 2/1981 | Craven | 455/115 |
| 4,727,337 A | | 2/1988 | Jason | 330/298 |
| 5,196,808 A | * | 3/1993 | Pickett et al. | 330/298 |
| 6,018,646 A | * | 1/2000 | Myllymäki et al. | 455/115 |

* cited by examiner

*Primary Examiner*—Michael B Shingleton
(74) *Attorney, Agent, or Firm*—Harness, Dickey & Pierce, P.L.C.

(57) ABSTRACT

A radio frequency (RF) power generator system includes a power generator that generates a RF power signal that is output to a load. The RF generator generates a forward power feedback signal and a reverse power feedback signal. A controller receives the forward power feedback signal and the reverse power feedback signal. The controller generates a setpoint signal that is output to the power generator. A setpoint modifier receives the forward feedback signal, the reverse feedback signal and an external setpoint signal. The setpoint modifier calculates a forward power limit based on the forward and reverse power feedback signals. The setpoint modifier and outputs a modified setpoint signal to the controller based on one of the forward power limit and the external setpoint signal. The setpoint modifier and the controller can be integrated.

20 Claims, 13 Drawing Sheets

FIG. 5A

| VSWR | load phase | pset | fwd | rev | PA0diss | PA1diss | PA2diss | PA3diss | avg_diss |
|---|---|---|---|---|---|---|---|---|---|
| 2 | 0 | 8000.00 | 8000.64 | 972.31 | 785.23 | 757.92 | 868.13 | 761.41 | 793.17 |
| 2 | 15 | 8000.00 | 7986.76 | 982.64 | 724.27 | 693.92 | 803.04 | 724.09 | 736.33 |
| 2 | 30 | 8000.00 | 8004.42 | 932.47 | 657.33 | 623.37 | 719.08 | 686.95 | 671.68 |
| 2 | 45 | 8000.00 | 8001.39 | 889.75 | 588.41 | 546.20 | 625.73 | 591.69 | 588.01 |
| 2 | 60 | 8000.00 | 8002.26 | 855.79 | 542.66 | 472.57 | 534.84 | 517.51 | 516.89 |
| 2 | 75 | 8000.00 | 8001.90 | 803.94 | 532.16 | 434.02 | 471.72 | 491.77 | 482.42 |
| 2 | 90 | 8000.00 | 8001.44 | 785.35 | 522.12 | 414.30 | 426.45 | 466.38 | 457.31 |
| 2 | 105 | 8000.00 | 8003.32 | 721.02 | 551.12 | 420.71 | 412.22 | 470.38 | 463.61 |
| 2 | 120 | 8000.00 | 8000.52 | 749.03 | 599.61 | 441.75 | 398.77 | 500.78 | 485.23 |
| 2 | 135 | 8000.00 | 8004.10 | 702.95 | 610.58 | 464.09 | 388.16 | 532.63 | 498.87 |
| 2 | 150 | 8000.00 | 7998.97 | 699.76 | 622.64 | 486.90 | 394.35 | 588.06 | 522.99 |
| 2 | 165 | 8000.00 | 7999.61 | 700.98 | 642.15 | 507.04 | 419.49 | 517.03 | 521.43 |
| 2 | 180 | 8000.00 | 8000.70 | 753.76 | 648.78 | 523.83 | 435.92 | 515.47 | 531.00 |
| 2 | 195 | 8000.00 | 7999.29 | 857.59 | 662.50 | 528.49 | 463.71 | 585.92 | 560.16 |
| 2 | 210 | 8000.00 | 8002.20 | 850.86 | 648.27 | 525.59 | 480.81 | 609.84 | 566.13 |
| 2 | 225 | 8000.00 | 7986.11 | 934.76 | 636.34 | 540.71 | 503.18 | 521.73 | 550.49 |
| 2 | 240 | 8000.00 | 7968.86 | 961.86 | 622.01 | 552.60 | 526.08 | 648.25 | 587.24 |
| 2 | 255 | 8000.00 | 7894.83 | 1002.26 | 632.88 | 568.55 | 555.21 | 671.89 | 607.13 |
| 2 | 270 | 8000.00 | 7846.71 | 1018.09 | 654.49 | 599.79 | 602.59 | 686.69 | 635.89 |
| 2 | 285 | 8000.00 | 7885.10 | 1007.16 | 697.22 | 654.03 | 666.87 | 742.28 | 690.10 |
| 2 | 300 | 8000.00 | 7864.38 | 1017.42 | 758.40 | 714.31 | 743.69 | 785.76 | 750.54 |
| 2 | 315 | 8000.00 | 7842.28 | 1022.44 | 810.51 | 767.77 | 809.92 | 843.38 | 807.89 |
| 2 | 330 | 8000.00 | 7876.25 | 1016.15 | 836.37 | 793.90 | 866.68 | 931.60 | 857.14 |
| 2 | 345 | 8000.00 | 7904.58 | 1009.85 | 825.54 | 793.81 | 884.90 | 877.08 | 845.33 |

CONTROLLER FOR RF POWER GENERATOR WITH REDUCED CABLE LENGTH SENSITIVITY

FIELD OF THE INVENTION

The present invention relates to controllers for radio frequency (RF) power generators, and more particularly to controllers for RF power generators with reduced cable length sensitivity.

BACKGROUND OF THE INVENTION

Many radio frequency power generators include controllers that regulate RF output power and prevent amplifier damage due to load mismatch, excessive supply voltage, and excessive operating temperature. The controllers also minimize damage after failure of one or more of the power devices. FIG. 1 shows a typical radio frequency (RF) power generator 10 that includes a power module 11 and a controller 12. The power module 11 receives signals from RF exciter 14, amplifies the signals, and delivers the signals to a load 16. The power module 11 includes a driver 18 and a final amplifier 20. The power module 11 receives DC power through a cable 24 that is coupled to a remote battery 26 with a ground return. The cable 24 may have substantial distributed impedance. The controller 12 includes an amplifier 30, a frequency compensation capacitor 34, and a buffer 38. The controller 12 receives control inputs 40 and feedback signals 42 and produces a control voltage 44 that varies the gain of the driver 18.

The controller 12 regulates output power during normal conditions and protects the power module 11 during abnormal conditions. The controller 12 employs negative feedback to diminish an error between the greatest feedback signal and a reference input that has been selected according to nominal operating levels of the feedback transducers. Feedback signals from the power module 11 include forward and reverse power signals 50 and 52 that are generated by RF detectors 54 and 56. The detectors 54 and 56 are typically coupled to sampling arms of a directional coupler 60. Other feedback signals include a temperature signal 62 from a thermistor 64 that is thermally coupled to the final amplifier 20. Differential voltage feedback signals 66 and 70 are proportional to DC input current to the power module 11 (through a current-sampling resistor 72). A drive signal 74 feeds back the drive current to the final amplifier 20. A feedback signal 76 feeds back the control voltage 44 that is supplied to the driver 18.

Under normal conditions, all of the feedback signals except the forward power signal 50 are small. The controller 12 increases the control signal 44 until the forward power signal 50 becomes approximately equal to a reference setpoint. Under abnormal conditions, the other feedback signals increase and exceed the forward power signal 50. For example, the reverse power signal 52 increases when the load 16 becomes mismatched or is removed. Increasing the drive signal 44 without a corresponding increase in the forward power signal 50 indicates load mismatch or malfunction of the final amplifier 20. Excessive control voltage for a given output power typically corresponds to a problem in the driver 18. Low DC input current indicates load mismatch, a faulty driver 18, or a faulty final amplifier 20. High DC input current or a high final amplifier 20 temperature indicates that the controller 12 should reduce forward power demands on the power module 11. When one or more of these conditions occur, the controller 12 reduces the drive signal 44 to the power module 11 to keep the largest feedback signal approximately equal to the reference setpoint.

Conventional methods for protecting the RF power generator 10 also typically employ a set of measured generator parameters and hard setpoint limits for each parameter. For example, maximum reflected power is limited to 600 watts (W), maximum power amplifier (PA) current is limited to 40 Amps (A), and maximum PA dissipation to 1800 W. This protection technique is effective in protecting the RF power generator 10 from adverse loads but does not give repeatable performance when a length of a cable between the RF power generator 10 and the load 16 is varied.

Referring now to FIG. 2, a simplified power generator control system 100 according to the prior art is illustrated. The RF power generator control system 100 includes a power module 102, a RF sensor 104, a load 106, and a controller 108. The power module 102 generates power module feedback signals 109 (such as PA supply current 110 and device temperature 114). The RF sensor 104 generates RF sensor feedback signals 115 (such as forward and reverse power 116 and 118). The power module feedback signals 109, the RF sensor feedback signals 115, and an external setpoint signal 120 are input to the controller 108. The controller 108 generates a power module setpoint signal 124 that is input to the power module 102. The power module setpoint signal 124 controls the forward power output by the power module 102.

The basic control technique is to provide negative feedback signals from various detectors (such as the forward power 116, the reverse power.118, the PA supply current 110, and the device temperature 114). During normal operation, all of the feedback signals except the forward power signal are relatively small. In this case, the controller 108 increases or decreases the power module setpoint signal 124 to regulate the forward power 116 of the power module 102. Under mismatched load conditions, another feedback signal, for example the supply current 110 to the power amplifier in the power module 102, dominates the forward power feedback 116. This will cause the controller 108 to reduce the power module setpoint 124. The power module 102 reduces the forward power delivered to the load 106.

This control technique is effective in protecting the generator from adverse loads but does not give repeatable performance when the cable length L between the power module 102 (the RF sensor 104) and the load 106 is varied. The change in the cable length L introduces a phase shift that may cause a high impedance load to be transformed into a low impedance load. The changes in the load impedance cause an increase or decrease in the current draw of the power amplifier in the power module 102. The impedance shift causes the supply current limiting loop of the power amplifier to reduce or increase the power module setpoint 124. This in turn causes the RF power generator control system 100 to deliver less or more power than the unphase-shifted case even though the voltage standing wave ratio (VSWR) has not changed.

In applications where repeatability is very important, such as semiconductor manufacturing, it may be very desirable to have a RF generator that has reduced sensitivity to cable length or load phase. For example, plasma delivery systems require precisely controlled conditions and repeatability. Some installations may have a longer distance from the chamber to the generator rack than others. Therefore, these systems will operate differently.

SUMMARY OF THE INVENTION

A radio frequency (RF) power generator system according to the invention includes a power generator that generates a RF power signal that is output to a load. The RF generator generates a forward power feedback signal and a reverse power feedback signal. A controller receives the forward power feedback signal and the reverse power feedback signal. The controller generates a setpoint signal that is output to the power generator. A setpoint modifier receives the forward feedback signal, the reverse feedback signal and an external setpoint signal. The setpoint modifier calculates a forward power limit based on the forward and reverse power feedback signals. The setpoint modifier and outputs a modified setpoint signal to the controller based on one of the forward power limit and the external setpoint signal.

In other features of the invention, the controller selects a lesser value between the forward power limit and the external setpoint signal. The power generator includes a RF sensor that generates the forward power feedback signal and the reverse power feedback signal. The power generator includes a power module that generates a supply current feedback signal and a temperature feedback signal that are output to the controller.

In still other features of the invention, the setpoint modifier and the controller are integrated. The setpoint modifier includes one of a lookup table and a formula for calculating the forward power limit. The formula determines the forward power limit based on the forward and reverse power feedback signals and maximum power dissipation.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 5A is a data table showing power dissipation as a function of load phase and power setpoint for a VSWR=2:1;

DETAILED DESCRIPTION OF THE PREFERRED EMBODIMENTS

The following description of the preferred embodiment(s) is merely exemplary in nature and is in no way intended to limit the invention, its application, or uses.

Figure 2:
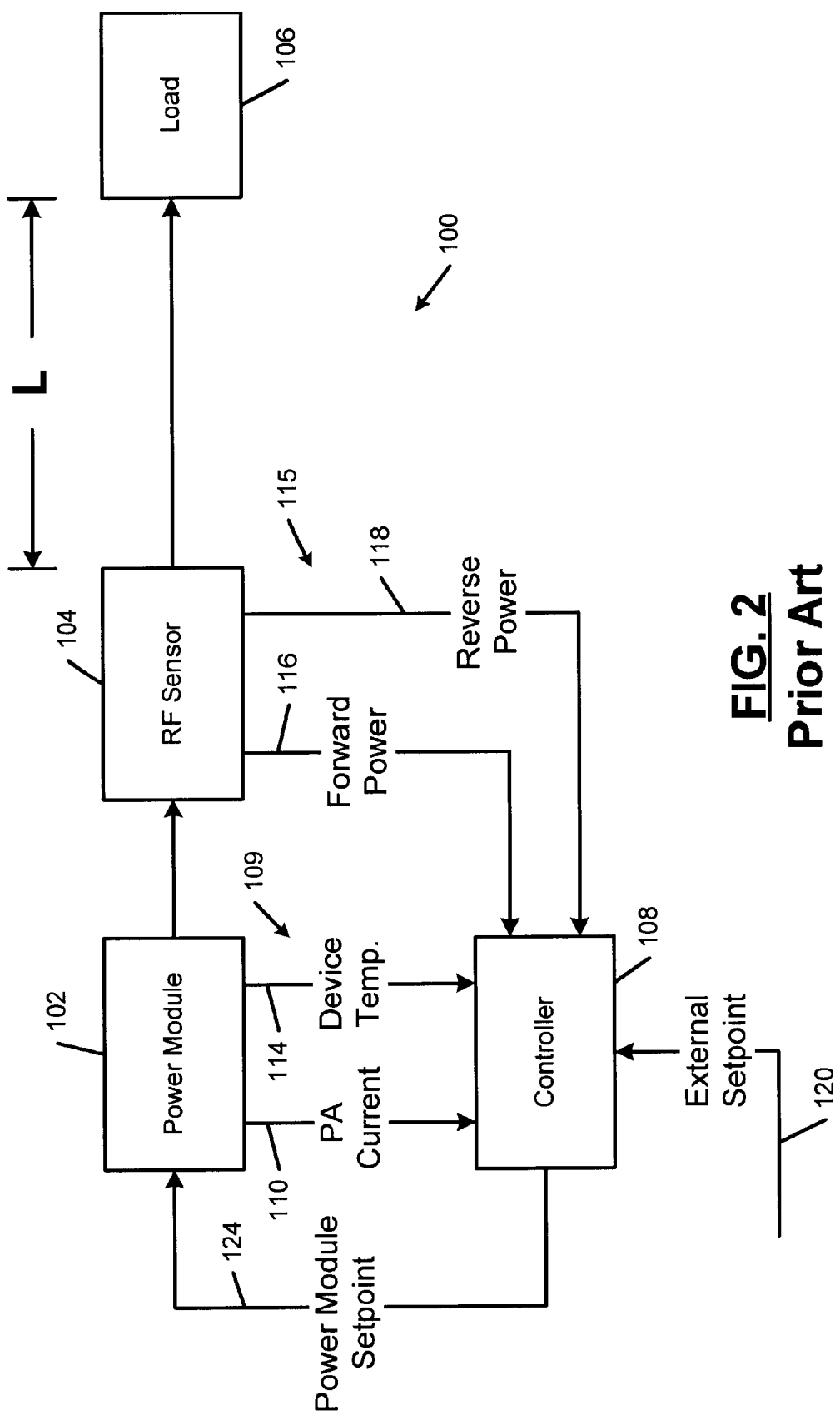
FIG. 2 is a simplified block diagram of an RF power generator according to the prior art.

Referring now to FIG. 2, the power generator control system 100 according to the prior art is illustrated. The power generator control system 100 includes the power module 102, the RF sensor 104, the load 106, and the controller 108. The power module 102 generates power module feedback signals 109 (such as the PA supply current 110 and the device temperature 114). The RF sensor 104 generates the RF sensor feedback signals 115 (such as the forward and reverse power 116 and 118). The power module feedback signals 109, the RF sensor feedback signals 115, and the external setpoint signal 120 are input to the controller 108. The controller 108 generates the power module setpoint signal 124 that is input to the power module 102.

Figure 3A:
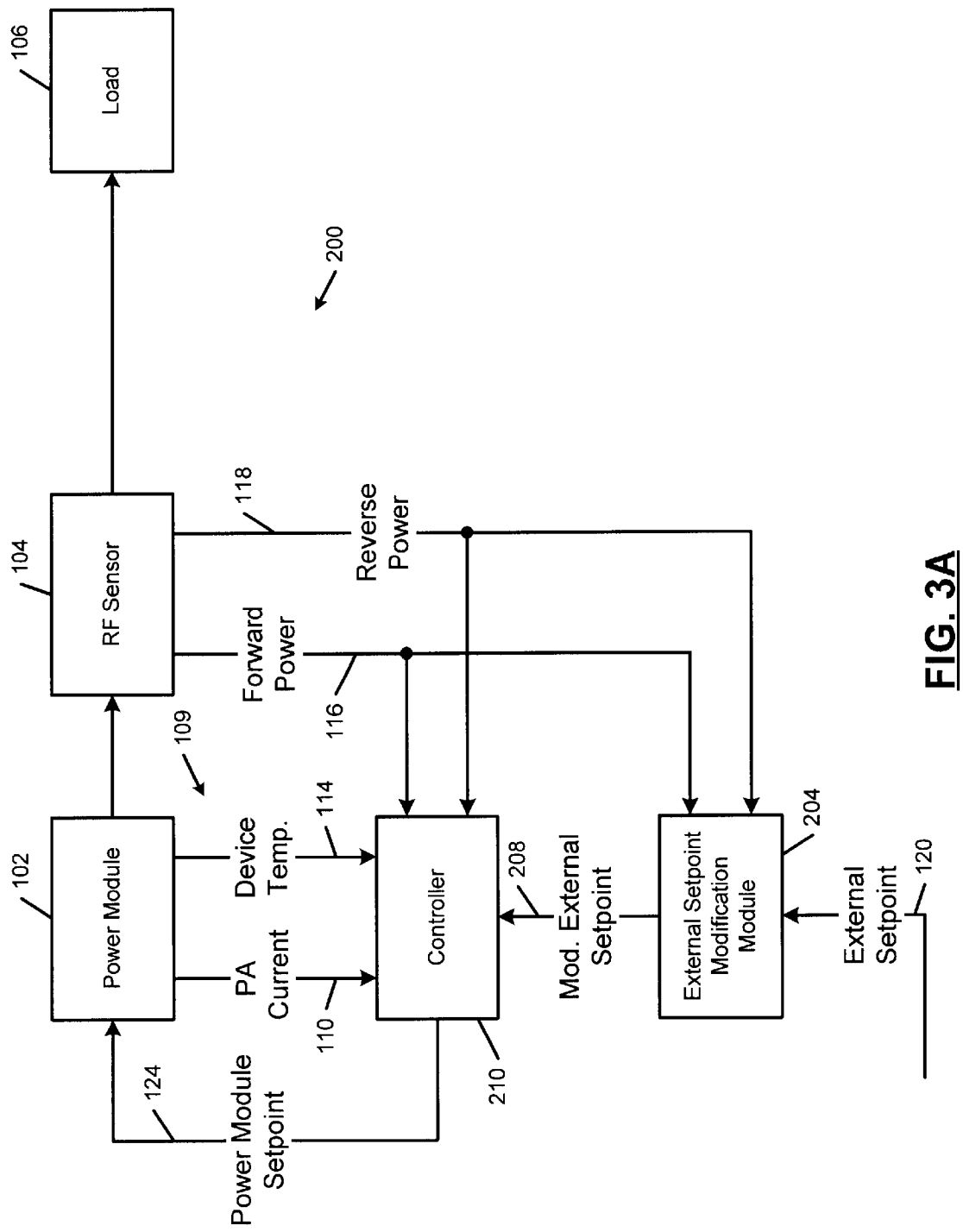
FIG. 3A is a block diagram of an RF power generator control system according to the present invention.
Figure 3B:
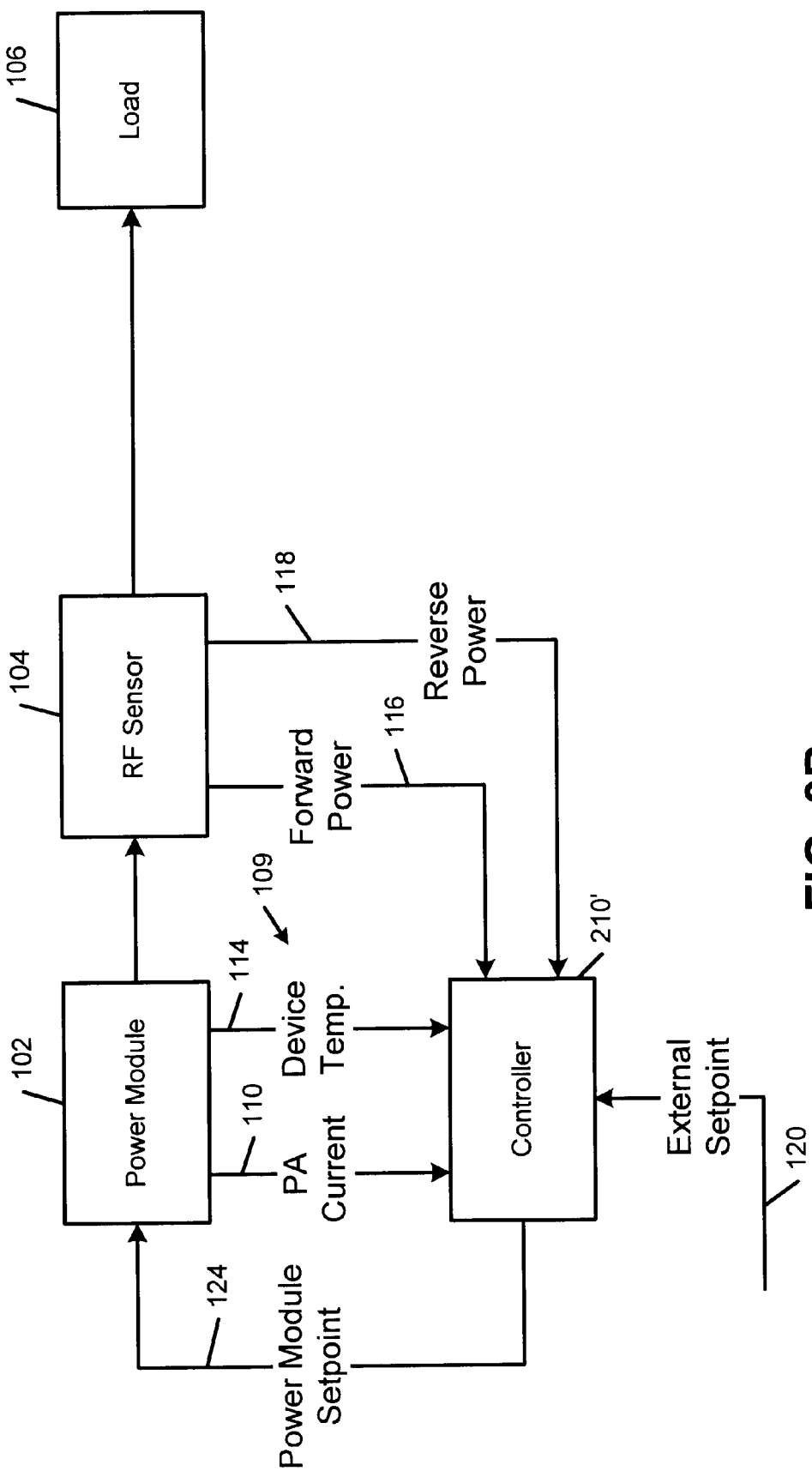
FIG. 3B is a block diagram of a RF power generator control system with a combined controller and external setpoint modification module.

Referring now to FIGS. 3A and 3B, reference numerals from FIG. 2 are used where appropriate to identify the same elements. An improved RF power generator control system 200 includes an external setpoint modification module 204 that calculates a forward power limit based on VSWR or gamma and selects the lesser of the forward power limit and the external setpoint. The external setpoint signal 120 is input to the external setpoint modification module 204. The forward and reverse power feedback signals 116 and 118 are input to the external setpoint modification module 204. The external setpoint modification module 204 generates a modified external setpoint signal 208 that is input to a controller 210. The modified external setpoint signal 208 is equal to the lesser of the forward power limit and the external setpoint.

The external setpoint modification module 204 is preferably implemented as an algorithm that is executed by a processor and memory. The external setpoint modification module 204 may also be implemented as a hardwired circuit and/or integrated with the controller 210 (as shown in FIG. 3B). The external setpoint modification module 204 employs a formula or look-up table that is derived from SPICE simulations or limit-test data as will be described further below. The formula or look-up table defines a forward power limit for a given VSWR (or gamma). The formula or look-up table is used to calculate the forward power limit in real time based on the actual VSWR (or gamma). Gamma and VSWR are related to the forward and reverse power as follows:

$$|gamma|=|\Gamma|=\text{sqrt}(P_{rev}/P_{fwd})$$

$$VSWR=(|\Gamma|+1)/(1-|\Gamma|))$$

The calculated forward power limit is used at the input of the feedback control system. The setpoint modification module 204 chooses the lesser of the external setpoint signal or the forward power limit as the setpoint for the RF generator control system 200. Alternately, the setpoint modification module 204 can calculate the forward power limit and transmit the forward power limit and the external setpoint to the controller 210 for selection. The power amplifier (PA) supply current 110, the device temperature 114 and other signals are retained to allow the controller 210 to react to abnormal conditions such as component failure. In the RF generator control system 200, the forward power limit remains constant for a given VSWR regardless of the phase length between the power module 102 and the load 106. Note that the distance L is shown between the RF sensor 104 and the load 106 because the distance between the power module 102 and the RF sensor 104 is fixed.

The present invention improves the repeatability of the forward power that is supplied by the RF generator regardless of the cable length L or other phase variations. The RF generator is limited to deliver the power that it is capable of for the worst-case load. Since the load impedance changes more quickly than variables such as the supply current 110 to the power amplifier and device temperature 114, the RF generator control system 200 reacts more quickly to the load 106. As a result, the RF generator sees lower supply current to the power amplifier and lower device temperature, which improves the long-term reliability of the RF generator.

Figure 4:
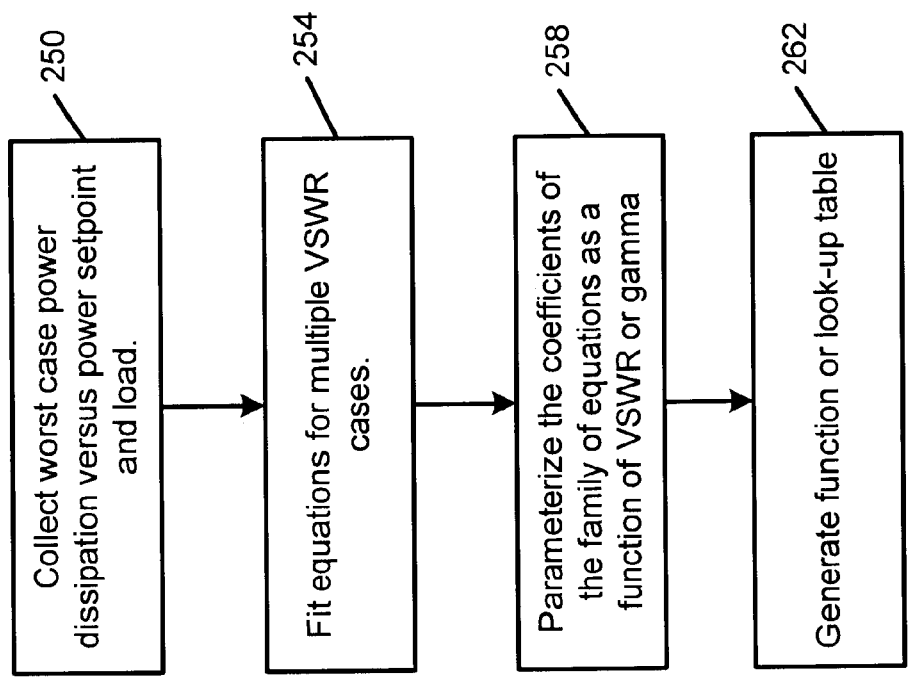
FIG. 4 illustrates steps for determining forward power as a function of gamma or VSWR.

One suitable method for determining the formula or look-up table is illustrated in FIG. 4. Skilled artisans will appreciate that other methods may be employed without departing from the spirit and scope of the invention. In step 250, the worst-case stress data is collected as a function of power setpoint and load. To determine the worst-case stress data for each VSWR, various cable lengths are used to determine the highest power dissipation in the power amplifier. When the cable length with the highest power dissipation is determined, the power dissipation is plotted as a function of the forward power. Skilled artisans can appreciate that the worst-case stress data can be determined using other system voltages and currents in addition to power dissipation. For example, power amplifier current, power amplifier supply voltage, power amplifier transistor peak output voltage and other system voltages and currents can be employed.

Figure 5B:
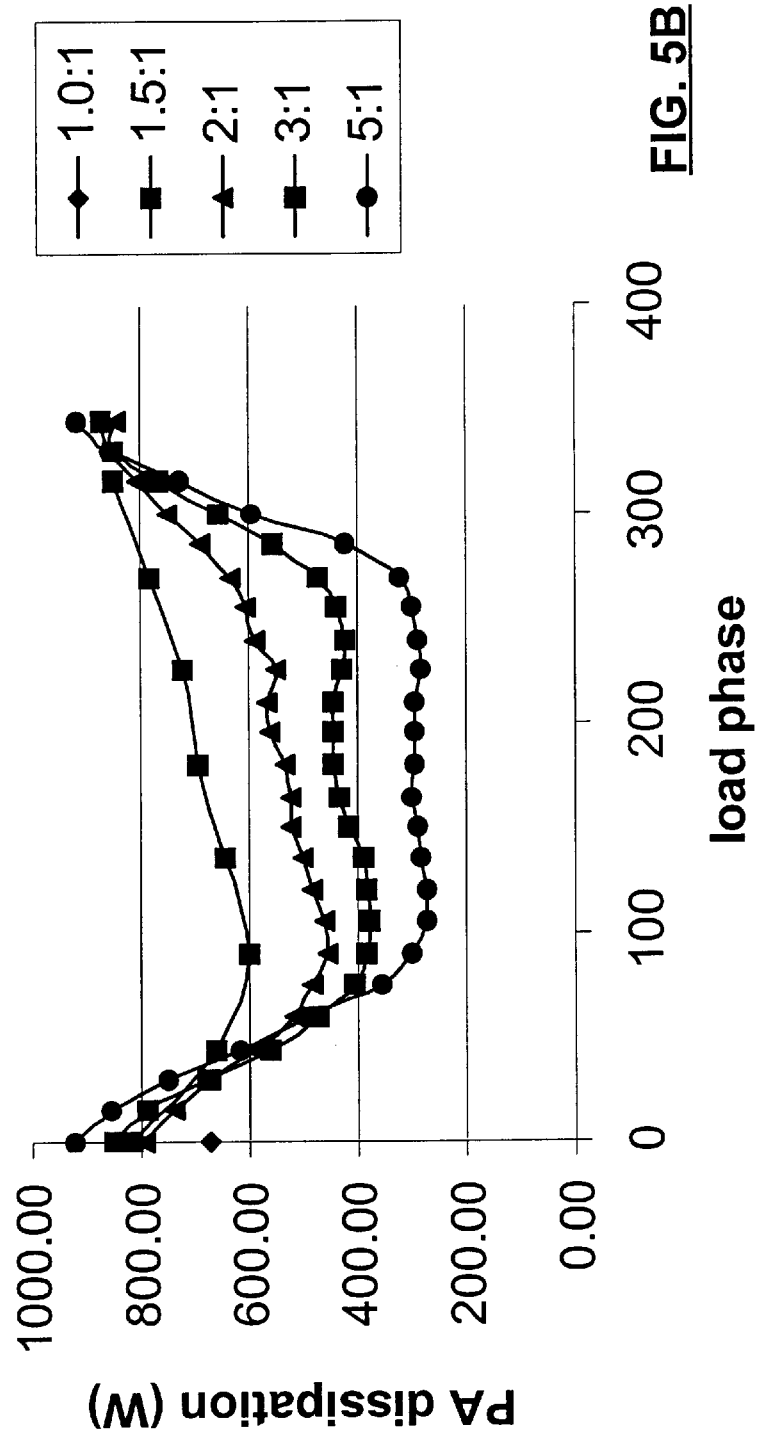
FIG. 5B is a graph depicting power dissipation as a function of load phase for various VSWR.
Figure 6:
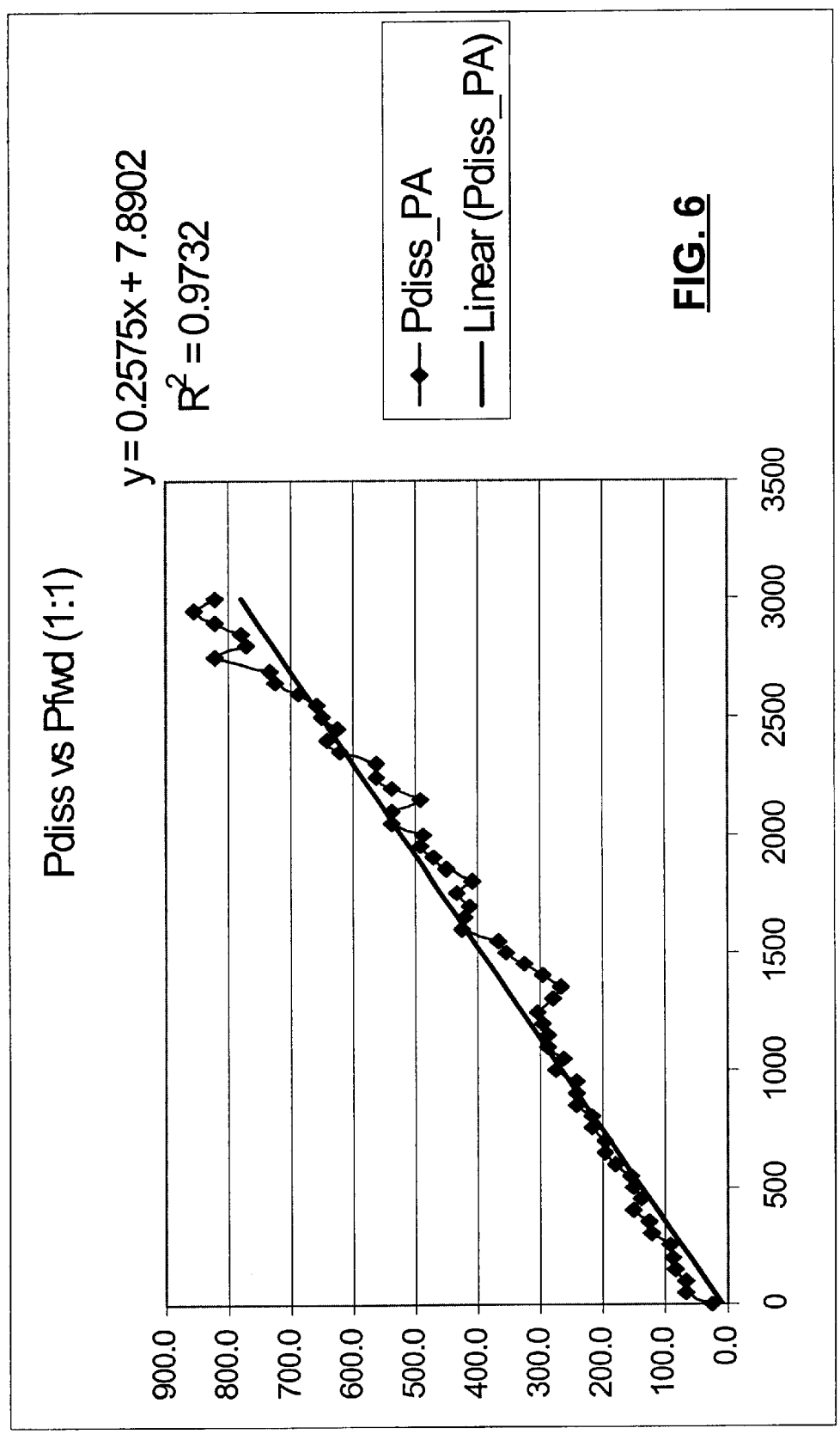
FIG. 6 is a graph depicting power dissipation as a function of forward power for a VSWR of 1:1.
Figure 7:
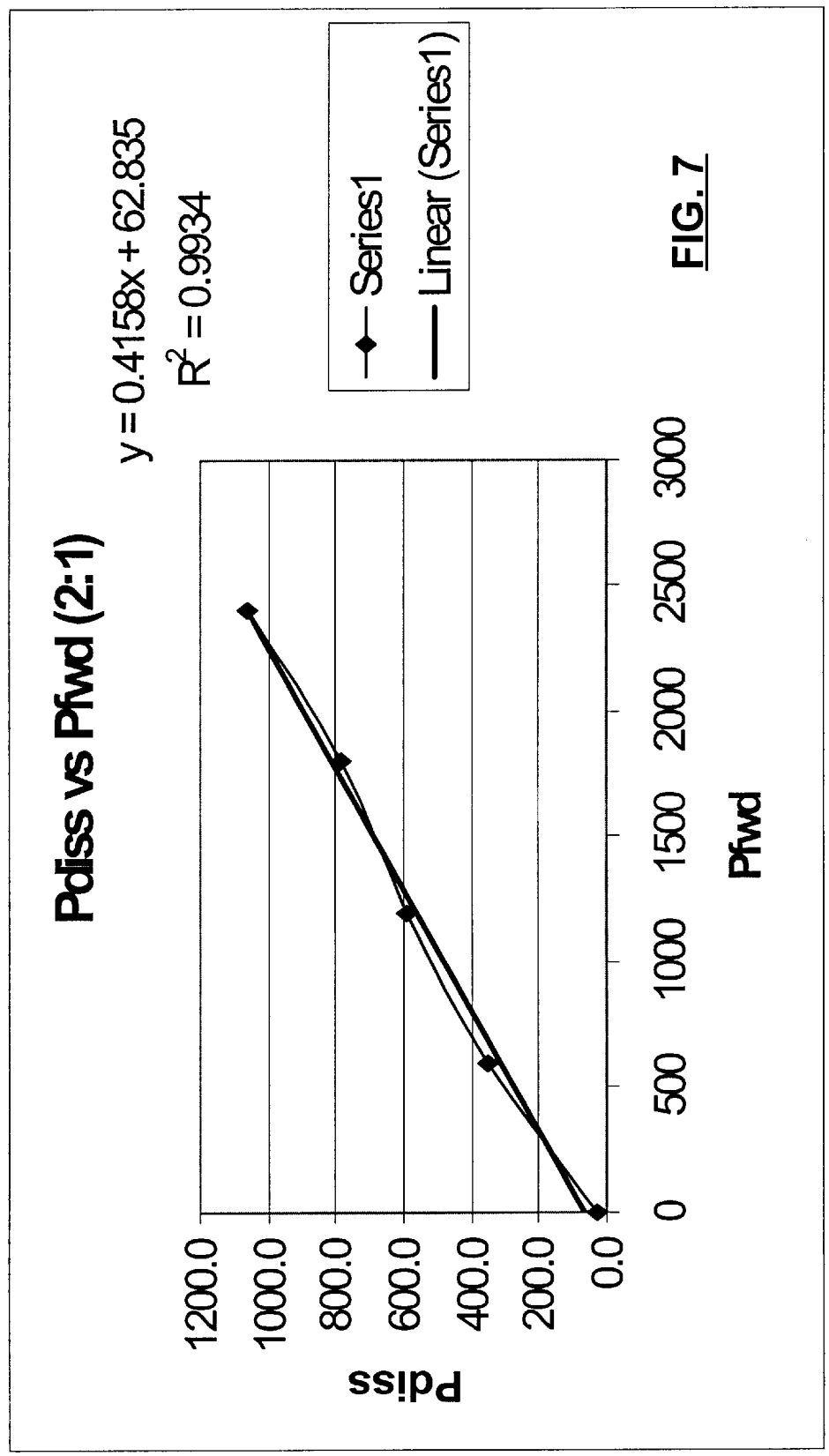
FIG. 7 is a graph depicting power dissipation as a function of forward power or a VSWR of 2:1.
Figure 8:
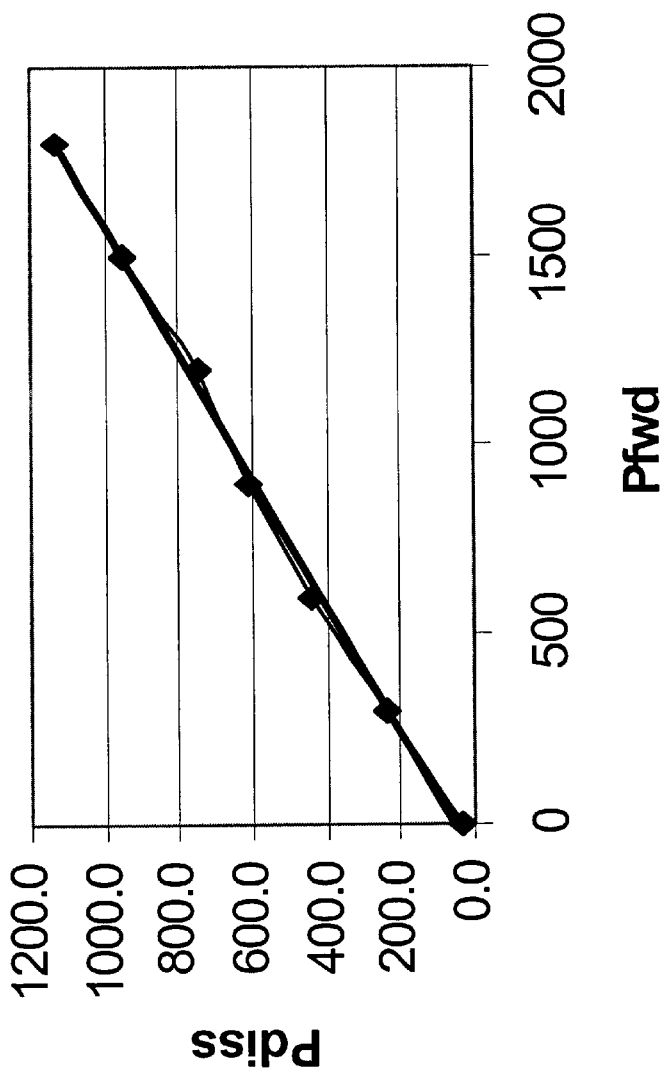
FIG. 8 is a graph depicting power dissipation as a function of forward power for a VSWR of 3:1.
Figure 9:
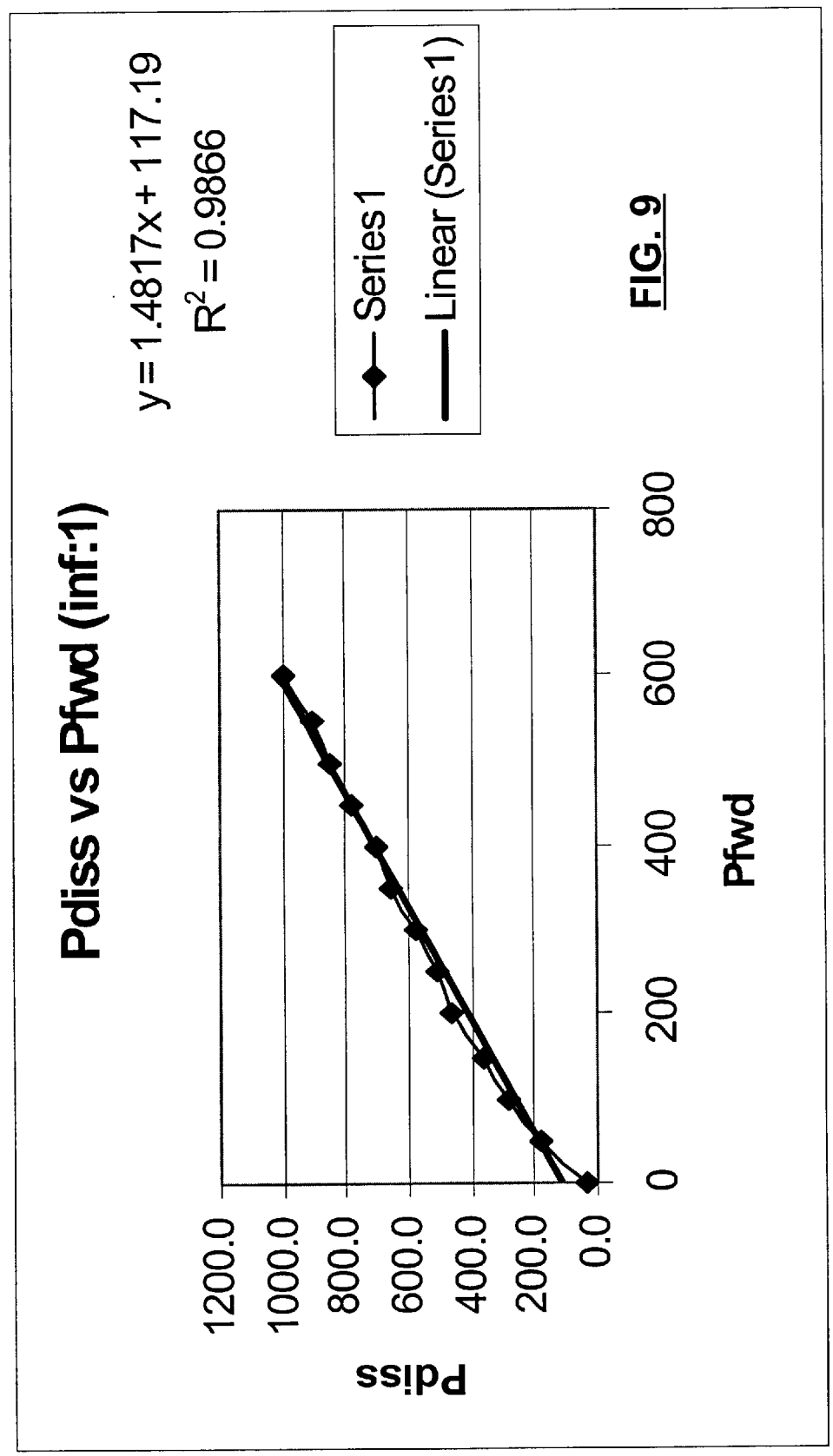
FIG. 9 is a graph depicting power dissipation as a function of forward power for a VSWR of infinity: 1.

For example, a data table for VSWR=2 is shown in FIG. 5A. Load phase refers to the number of degrees around the Smith Chart. 360° around the Smith Chart corresponds to one-half wavelength. To determine cable lengths for different types of cable, the frequency of operation and the velocity factor of the cable material are employed. When Teflon cable is employed, once around the Smith Chart is equal to 25.19 feet. For polypropylene cable, the one-half wavelength distance is equal to 23.95 feet (24 feet is often a good approximation). FIG. 5A shows power dissipation in the power amplifier at rated power as a function of load phase for VSWR=2. FIG. 5B is a graph illustrating power dissipation in the power amplifier as a function of load phase for various VSWRs. In this example, the worst power dissipation occurred near 0 degrees. Different power amplifiers will have different results.

After identifying the worst case power dissipation, the identified load is used to plot power dissipation as a function of forward power. Equations are fit to the power dissipation vs. forward power data in step 254. The equations that are fit can be linear equations, quadratic equations or any other suitable equations. Preferably, however, the form of the equation that is fit for each VSWR is the same. In the example illustrated in FIGS. 6, 7, 8 and 9, a linear equation in the form of y=mx+b is fit to the worst case data for VSWR=1, 2, 3 and infinity.

Figure 10:
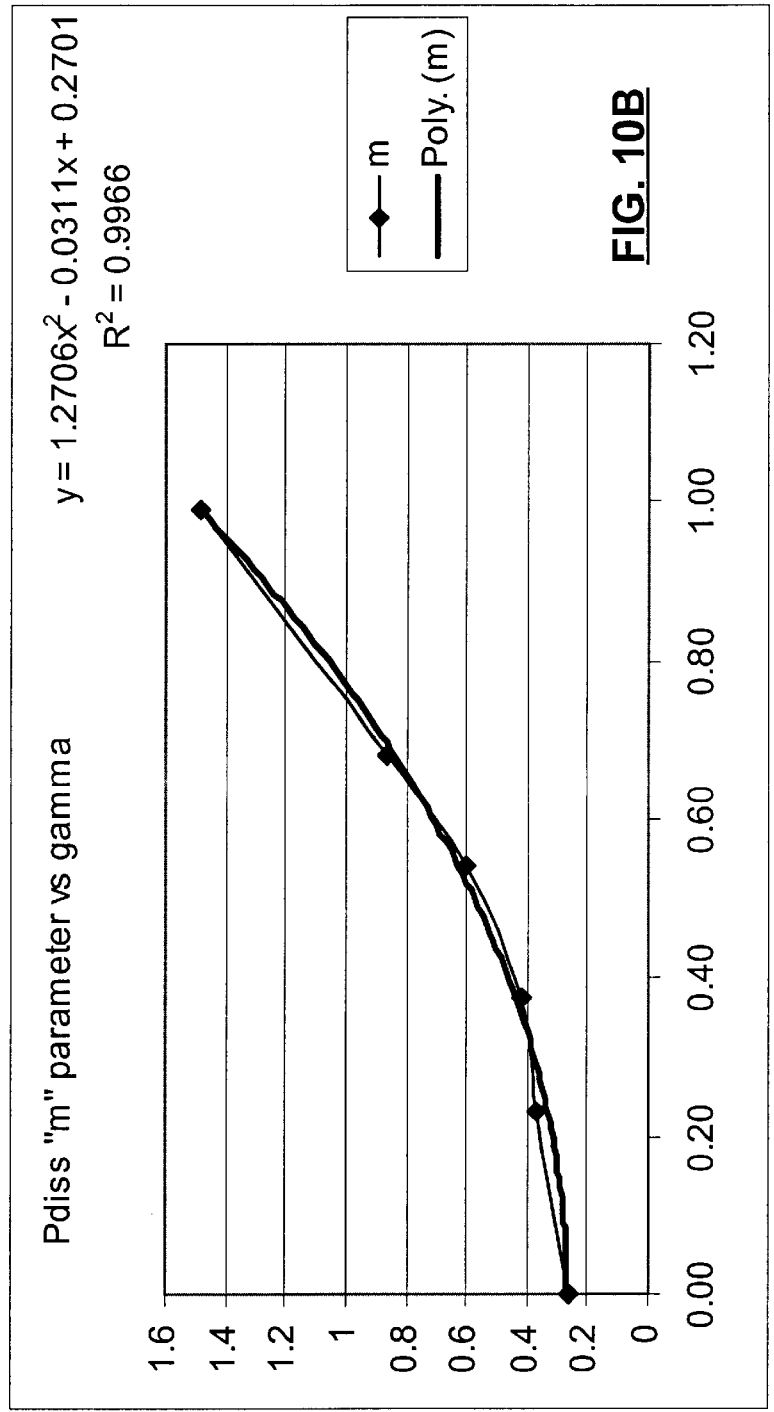
FIG. 10A is a data table containing quadratic and linear model parameters for worst case loads at various VSWR.
FIG. 10B is a plot that parameterizes the power dissipation "m" parameter as a function of gamma.

In step 258, the coefficients of the family of equations are parameterized as a function of VSWR. As can be seen in FIG. 10, the "m" parameter of the linear equations define a three-dimensional function–$P_{diss}$ (power amplifier dissipation) as a function of forward power and VSWR (or gamma). Then, in step 262, the formula or look-up table is generated.

Working through an example, graphs are generated for $P_{diss}$ VS. $P_{fwd}$ for the worst phase power dissipation of the 1:1, 1.5:1, 2:1, 3:1, 5:1, and infinity:1 VSWR loads. Next, straight lines are fit to each graph and the slope (m) and offset (b) are extracted as is shown in FIG. 10A. While quadratic fitting works better for the 1:1 and 1.5:1 VSWR loads in this example, straight line fitting also works very well for the higher VSWR values. Straight line fitting was selected in this example.

Next, the slope (m) is graphed as a function of the reflection coefficient (Γ) and a curve is fit to this data to generate the function m(Γ) as is shown in FIG. 1B. The b parameter does not change much with Γ, so b can be kept constant. b can also be adjusted to make the model more conservative and to provide more power dissipation headroom.

The function $P_{dmax}$(Pfwd,Γ) generates a family of straight lines that estimate the maximum dissipation of the PA for a given VSWR (or Γ) Smith chart circle. There are other cable lengths at a given VSWR with lower power dissipation, but the goal is to identify the worst case for power dissipation in the power amplifier. Using b=100 gives the best fit at loads other than 1.5:1. However, b=200 gives conservative numbers for 1.5:1 as well.

slope function: $m(\Gamma)=1.2760*\Gamma^2 -0.0311\ \Gamma*+0.2701$.

family of linear equations, y=mx+b:

$P_{dmax}(P_{fwd}, \Gamma)=P_{fwd} * m(\Gamma)+b$.

The following data demonstrates that the model compares favorably against actual data: $P_{dmax}$(3000, 0)=1010W–estimated maximum dissipation into a 50 ohm load at 3000W (actual is 822W). $P_{dmax}$(3000, 0.2)=1144W–estimated max dissipation into a 1.5:1 at 3000W (actual is 1189W). $P_{dmax}$(2400, 0.333)=1162W –estimated max dissipation into a 2:1 VSWR at 2400W (actual is 1100W). $P_{dmax}$(1800, 0.5)=1230W–estimated max dissipation into a 3:1 VSWR at 1800W (actual is 1131W). $P_{dmax}$(600, 1)=1106W–estimated max dissipation into a infinite VSWR at 600W (actual is 991W).

To find the forward power at which the dissipation equals 1200W:

$P_{dmax}=1200$.

$P_{fmax}(\Gamma)=-1*(P_{dmax}-200)/(-1.2760*\Gamma^2+0.0311 *\Gamma-0.2701)$

Figure 11:
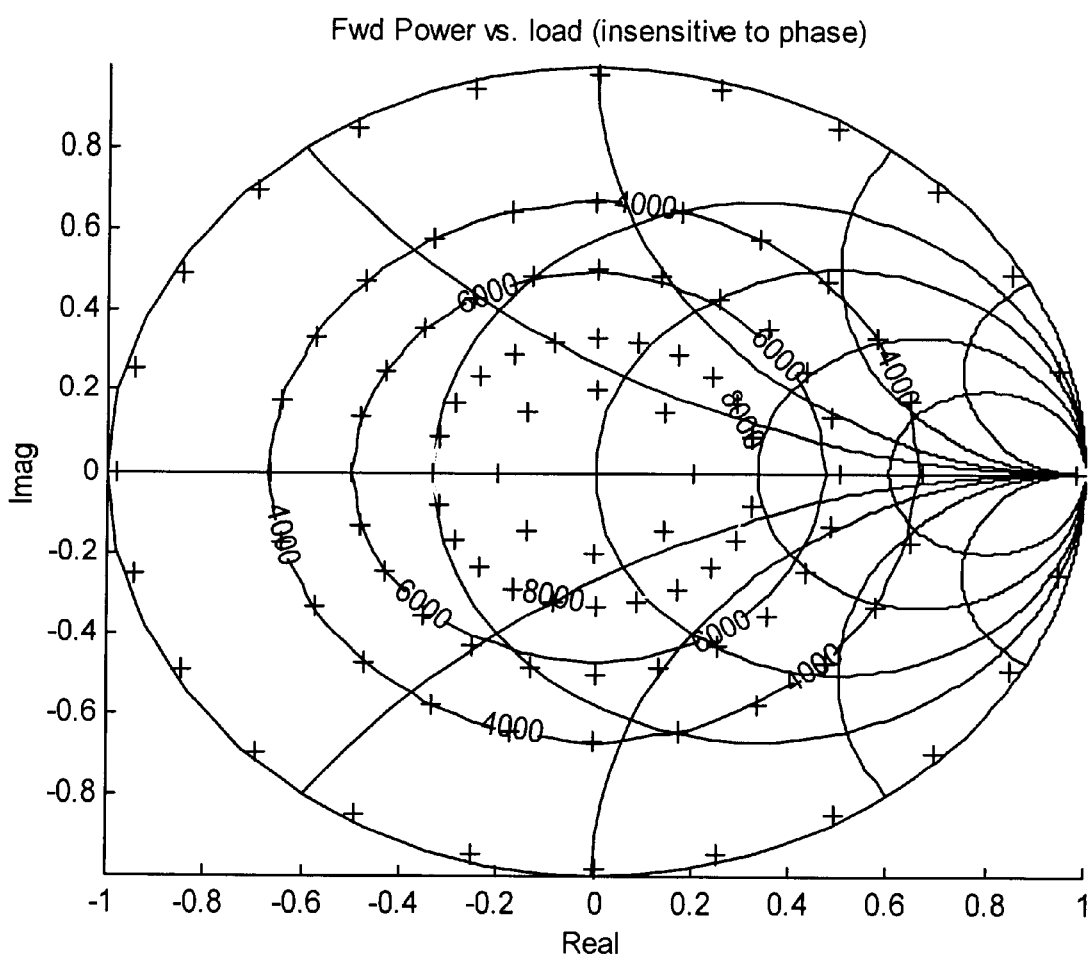
FIG. 11 is a Smith Chart that shows the resulting forward power versus load for various VSWR for the RF power generator control system.

The derating function compares favorably against the 3000W fwd power specification: $P_{fmax}$(0)=3702W (specification is 3kW into 1:1); $P_{fmax}$(0.2)=3178W (specification is 2400W into 2:1); $P_{fmax}$(0.3333)=2494W (specification is 1800W into 3:1); $P_{fmax}$(0.5)=1748W (specification is 1800W into 3:1); and, $P_{fmax}$(1)=662.4W (specification is 600W into infinity:1). Referring now to FIG. 11, a Smith Chart shows forward power versus load for various VSWR when employing the RF generator control system according to the present invention. The "+" signs denote the cable length samples. The center ring corresponds to VSWR=1.5:1. The ring labeled "8000" corresponds to VSWR=2:1. The ring labeled "6000" corresponds to VSWR=3:1. The ring labeled "4000" corresponds to VSWR=5:1. The outer ring corresponds to VSWR infinity:1. As can be appreciated, the RF generator is insensitive to phase variation.

Figure 1:
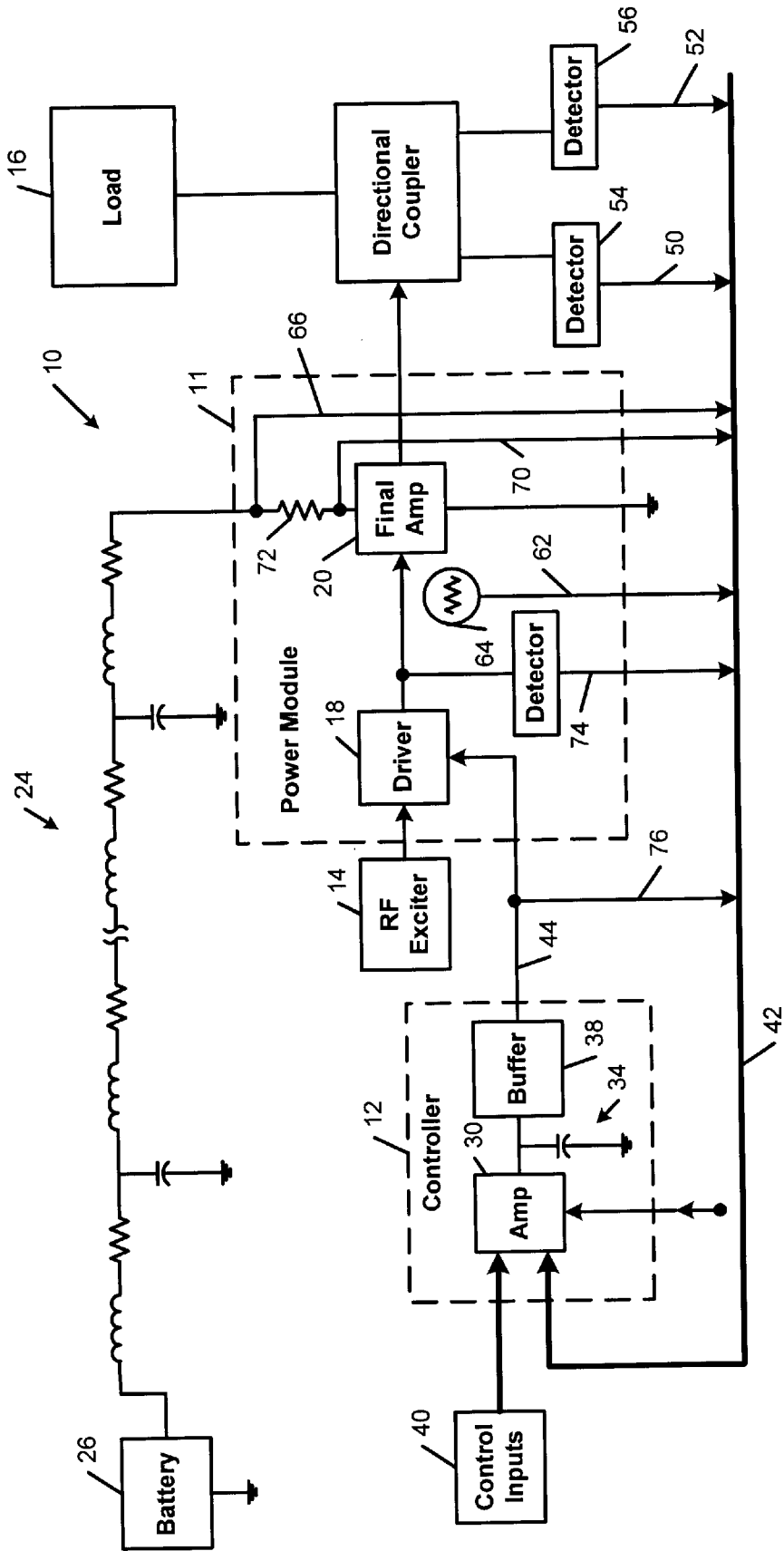
FIG. 1 is a block diagram of an RF power generator according to the prior art that includes a controller.

Skilled artisans can appreciate that the forward and reflected power signal can be provided by a directional coupler as is illustrated in FIG. 1, a voltage/current probe or any other suitable source. Input data for determining the formula or look-Up table can be determined using SPICE simulation or experimental measurements. In addition, the formula or look-up table can be determined by using a number of linear fitting techniques such as least squares or nonlinear fitting techniques. The calculation of the forward power limit can be performed by an analog, digital signal processor (DSP), digital computer or any other suitable device. Likewise, the closed loop control can be analog or digital.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specifications and the following claims.

What is claimed is:

1. A radio frequency (RF) power generator system, comprising:
   a power generator that generates a RF power signal that is output to a load, a forward power feedback signal and a reverse power feedback signal;
   a controller that receives said forward power feedback signal and said reverse power feedback signal and that generates a setpoint signal that is output to said power generator; and
   a setpoint modifier that receives said forward feedback signal, said reverse feedback signal and an external setpoint signal, wherein said setpoint modifier calculates a forward power limit based on said forward and reverse feedback signals and outputs a modified setpoint signal to said controller based on one of said forward power limit and said external setpoint signal.

2. The RF power generator system of claim 1 wherein said controller selects a lesser value of said forward power limit and said external setpoint signal as said modified setpoint signal.

3. The RF power generator system of claim 2 wherein said power generator includes a RF sensor that generates said forward power feedback signal and said reverse power feedback signal.

4. The RF power generator system of claim 3 wherein power generator includes power module that generates a supply current feedback signal and a temperature feedback signal that are output to said controller.

5. The RF power generator system of claim 3 wherein said setpoint modifier and said controller are integrated.

6. The RF power generator system of claim 5 wherein said setpoint modifier includes one of a lookup table and a formula for calculating said forward power limit from said forward and reverse feedback signals.

7. The RF power generator system of claim 6 wherein said power generator includes a power amplifier and wherein said formula determines said forward power limit based on gamma and at least one of maximum power dissipation, supply current, supply voltage and output voltage of said power amplifier.

8. A method of controlling a radio frequency (RF) power generator that generates a RF power signal for a load, comprising the steps of:
   sensing a forward power feedback signal;
   sensing a reverse power feedback signal;
   receiving an external setpoint signal;
   calculating a forward power limit based on said forward and reverse power feedback signals; and
   controlling said RF power generator based on one of said forward power limit and said external setpoint signal.

9. The method of claim 8 further comprising the step of:
   selecting a lesser value of said forward power limit and said external setpoint signal; and
   transmitting said lesser value to a power module.

10. The method of claim 9 further comprising the step of:
    generating said forward power feedback signal and said reverse power feedback signal using an RF sensor in said RF power generator.

11. The method of claim 10 further comprising the step of:
    generating a supply current feedback signal and a temperature feedback signal using said power module of said RF power generator.

12. The method of claim 8 wherein said forward power limit is calculated using one of a lookup table and a formula.

13. The method of claim 12 wherein said power generator includes a power amplifier and wherein said formula defines a relationship between gamma, said forward power limit, and at least one of power dissipation, supply current, supply voltage and output voltage of said power amplifier.

14. The method of claim 13 wherein said formula is calculated by:
    a) identifying a cable length between 0 and one-half wavelength with a highest power dissipation at a first VSWR;
    b) repeating step (a) for a plurality of VSWRs;
    c) for each of said VSWRs, determining a mathematical approximation of power dissipation as a function of forward power for said cable length having said highest power dissipation; and
    d) parameterizing said mathematical approximation as a function of one of VSWR and gamma.

15. The method of claim 14 wherein said mathematical approximation is a linear approximation.

16. A method of controlling a radio frequency (RF) power generator that generates a RF power signal for a load to reduce sensitivity to variations in a cable length between said RF power generator and said load, comprising the steps of:
    a) identifying a cable length between 0 and one-half wavelength with a highest power dissipation at a first VSWR;
    b) repeating step (a) for a plurality of VSWRs;
    c) for each of said VSWRs, determining a mathematical approximation of power dissipation as a function of forward power for said cable length having said highest power dissipation;
    d) parameterizing said mathematical approximations as a function of gamma;
    e) defining a forward power limit formula based on said parameterization; and
    f) programming a controller with said forward power limit formula.

17. The method of claim 16 further comprising the steps of:
    sensing a forward power feedback signal; and
    sensing a reverse power feedback signal.

18. The method of claim 17 further comprising the steps of:
    receiving an external setpoint signal; and
    calculating a forward power limit based on said forward power limit formula.

19. The method of claim 18 further comprising the steps of:
    controlling said RF power generator based on said forward power limit and said external setpoint signal.

20. The method of claim 19 further comprising the step of:
    generating a modified setpoint signal equal to a lesser value of said forward power limit and said external setpoint signal.

* * * * *